US007041993B2

(12) United States Patent
Chandhok et al.

(10) Patent No.: US 7,041,993 B2
(45) Date of Patent: May 9, 2006

(54) PROTECTIVE COATINGS FOR RADIATION SOURCE COMPONENTS

(75) Inventors: Manish Chandhok, Portland, OR (US); Kramadhati V. Ravi, Atherton, CA (US); Robert Bristol, Portland, OR (US); Melissa Shell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 57 days.

(21) Appl. No.: 10/921,407

(22) Filed: Aug. 18, 2004

(65) Prior Publication Data

US 2005/0019492 A1 Jan. 27, 2005

Related U.S. Application Data

(62) Division of application No. 10/326,574, filed on Dec. 20, 2002, now Pat. No. 6,809,326.

(51) Int. Cl.
*H05H 1/24* (2006.01)
*H01J 61/04* (2006.01)
*C23C 16/00* (2006.01)

(52) U.S. Cl. .............................. 250/504 R; 250/493.1; 427/249.8

(58) Field of Classification Search ..................... None
See application file for complete search history.

(56) References Cited

U.S. PATENT DOCUMENTS

| | | | | |
|---|---|---|---|---|
| 6,387,572 | B1 | 5/2002 | Tong et al. | |
| 6,406,981 | B1 | 6/2002 | Ravi | |
| 6,479,830 | B1 | 11/2002 | Fornaca et al. | |
| 6,566,668 | B1 | 5/2003 | Rauch et al. | |
| 6,586,757 | B1 | 7/2003 | Melnychuk et al. | |
| 6,621,022 | B1 | 9/2003 | Ma et al. | |
| 6,847,044 | B1 * | 1/2005 | Rice et al. .............. | 250/504 R |

OTHER PUBLICATIONS

Bollier, Roger, "Crystal Clear," Cutting Tool Engineering, May 2002, vol. 54, No. 5, 3 pgs.
Lammers, David, "EUV heads for implementation amid questions," http://www.eetimes.com/story/OEG20010413S0042, Apr. 13, 2001, 3 pgs.
"Combat® Solid Boron Nitride," Saint-Gobain Ceramics, 2003, 2 pgs.
"JMAR and Advanced Semiconductor Lithography," http://www.jmar.com/co451.html, printed Dec. 12, 2002, 4 pgs.

(Continued)

*Primary Examiner*—Nikita Wells
(74) *Attorney, Agent, or Firm*—Schwabe, Williamson & Wyatt, P.C.

(57) ABSTRACT

Erosion-resistive coatings are provided on critical plasma-facing surfaces of an electrical gas plasma head for an EUV source. The erosion-resistive coatings comprise diamond and diamond-like materials deposited onto the critical plasma-facing surfaces. A pure diamond coating is deposited onto the plasma exposed insulator surfaces using, for example, a chemical vapor deposition processes. The diamond coating is made conductive by selective doping with p-type material, such as, but not limited to, boron and graphite.

14 Claims, 3 Drawing Sheets

OTHER PUBLICATIONS

"JMAR Updates Its EUV Source Program At DARPA Advanced Lithography Conference," http://www.semiseeknews.com/press_release3592.htm, Apr. 18, 2002, printed Dec. 12, 2002, 4 pgs.

"Manufacturer's Attack Downtime, Increase Output Using Diamond Coated Tools," Diamond Tool Coating, www.diamondtc.com, date unknown, 1 pg.

* cited by examiner

| No | Material | Thermal conductivity (W/cm-K) | Linear Thermal Expansion coeff. ($x10^{-5}/°K$) | Max. temperature (°C) |
|---|---|---|---|---|
| 1 | CVD diamond | 10-20 | 0.8-1.5 | ~4000 |
| 2 | BN (OB) Parallel to pressing (II) | 0.30 | 11.9 | 1800 |
| 3 | BN (OB) Perpendicular to pressing (⊥) | 0.33 | 3.1 | 1800 |
| 4 | BN (CA) (II) | 0.27 | 2.95 | 1800 |
| 5 | BN (CA) (⊥) | 0.31 | 0.87 | 1800 |
| 6 | BN (XP) (II) | 0.71 | 0.6 | 3000 |
| 7 | BN (XP) (⊥) | 1.21 | -0.46 | 3000 |
| 8 | SiC | 1.20 | 4 | 1650 |
| 9 | IRBAS | 0.1 | 2.1 | >>2000 |
| 10 | Nitroxyceram | 0.266 | 2.27 | >>2000 |

FIG. 5

PROTECTIVE COATINGS FOR RADIATION SOURCE COMPONENTS

CROSS REFERENCES TO RELATED APPLICATIONS

This application is a divisional application of U.S. application Ser. No. 10/326,574, filed Dec. 20, 2002 now U.S. Pat. No. 6,809,326.

FIELD OF THE INVENTION

The present invention relates to extreme ultraviolet lithography, and more particularly, to erosion resistant coatings for components of EUV sources.

BACKGROUND OF INVENTION

Optical lithography is a key element in integrated circuit (IC) production. It involves passing radiation (light) through a mask of a circuit design and projecting it onto a substrate, commonly a silicon wafer. The light exposes special photoresist chemicals on the surface of the wafer which is used to protect unetched circuit details. Integrated circuit feature resolution is directly related to the wavelength of the radiation. The demand for ever smaller IC features is driving the development of illumination sources that produce radiation having ever smaller wavelengths. Extreme ultraviolet light (EUV) has shorter wavelengths than visible and UV light and can therefore be used to resolve smaller and more numerous features.

Extreme ultraviolet lithography is a promising technology for resolving feature size of 50 nm and below. There are many problems in order to realize EUV lithography and the most serious problem is to develop the EUV radiation source. An EUV source with a collectable radiation power of 50 W to 150 W at over 5 kHz in the spectral range of 13–14 nm will be required to achieve requirements for high volume manufacturing of 300 mm wafers.

Electrical discharge gas plasma devices (EUV lamps) are under investigation as promising EUV sources. The principle consists of heating up certain materials into a plasma to such a level that the material emits EUV radiation. Potential source materials which emit EUV radiation at excited energy levels include xenon, oxygen, and lithium. The aim is to produce as many photons as possible in the required wavelength range. A pulsed discharge of electrically stored energy across a gap between a cathode and an anode is used in the presence of the gas for the creation of plasma with temperatures of several 100,000 C. This plasma emits thermal radiation in the spectral range of around 10 nm to 20 nm.

FIG. 1 is a cross-sectional view of one possible configuration of an electrical discharge gas plasma head 10 capable of producing an EUV-emitting plasma 20. The plasma head 10 comprises a plurality of closely positioned electrodes, in this example represented as a cathode 12 and anode 14, separated by an insulator base 16 or ring separator.

The area between the cathode 12 and anode 14 is filled with an ionizing gas 22. A plasma discharge 17 initiated near the base 19 travels along the cathode 12 and anode 14 through self-induced electromagnetic forces. Upon reaching the cathode tip 18 and anode tip 15, the discharge 17 compresses upon itself densifying, heating, and emitting EUV excitations. Other electrode/insulator geometry is possible but all share the property of producing pinched plasma in close proximity to one of more surfaces of the plasma head.

In operation, a tremendous heat load, on the order of 5 kW/cm$^2$, is experienced by the components of the plasma head 10. The plasma-facing components (PFCs) include: an inner cathode surface 11 of the cathode 12, an outer anode surface 13 of the anode 14, and exposed insulator base surfaces 19 of the insulator base 16. Regardless of the specific component configuration and arrangement, there will be at least some PFCs that are susceptible to the effects of the operation of the plasma head 10.

The PFCs are commonly only a few millimeters from the plasma 20 and in an erosive environment that quickly damages the PFC's. This erosion severely effects performance, lifetime and reliability of the discharge head 10. In particular, the anode 14 tends to erode more quickly than the cathode 12, which puts severe limitations on the lifetime of the discharge head 10 as well as producing debris that can impinge upon and harm the other components of the plasma head and overall system, as well as harm exposed targets being illuminated. provide little protection, at best, for the PFCs. One attempt incorporated internal cooling channels within the structure of the cathode 12 which helps to keep the bulk structure of the cathode 12 from overheating, but provides little protection for the plasma facing inner cathode surface 11 of the cathode 12 from erosion and thermal damage, and provide nil protection for the outer anode surface 13.

The cathode 12 and anode 14 are commonly made from refractory metals, such as tungsten or molybdenum which are more resistant to the effects of extreme heat. These materials are expensive, difficult to machine, and are prone to cracking when structurally loaded under sever heating conditions. These materials, none the less, erode over time in this environment.

The insulator components, namely the insulator base 16, comprise various ceramic materials, all of which suffer to some extent, from thermal cracking and erosion in these environments.

In order for the electric discharge plasma EUV sources to meet commercial requirements and demands, including reliability and productivity, lifetime-extending improvements will have to be made for the components of the discharge head 10.

BRIEF DESCRIPTION OF DRAWINGS

FIG. 5 is a table of candidate insulator materials used to electrically insulate conductive components of the discharge head in accordance with embodiments of the present invention.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Figure 1:
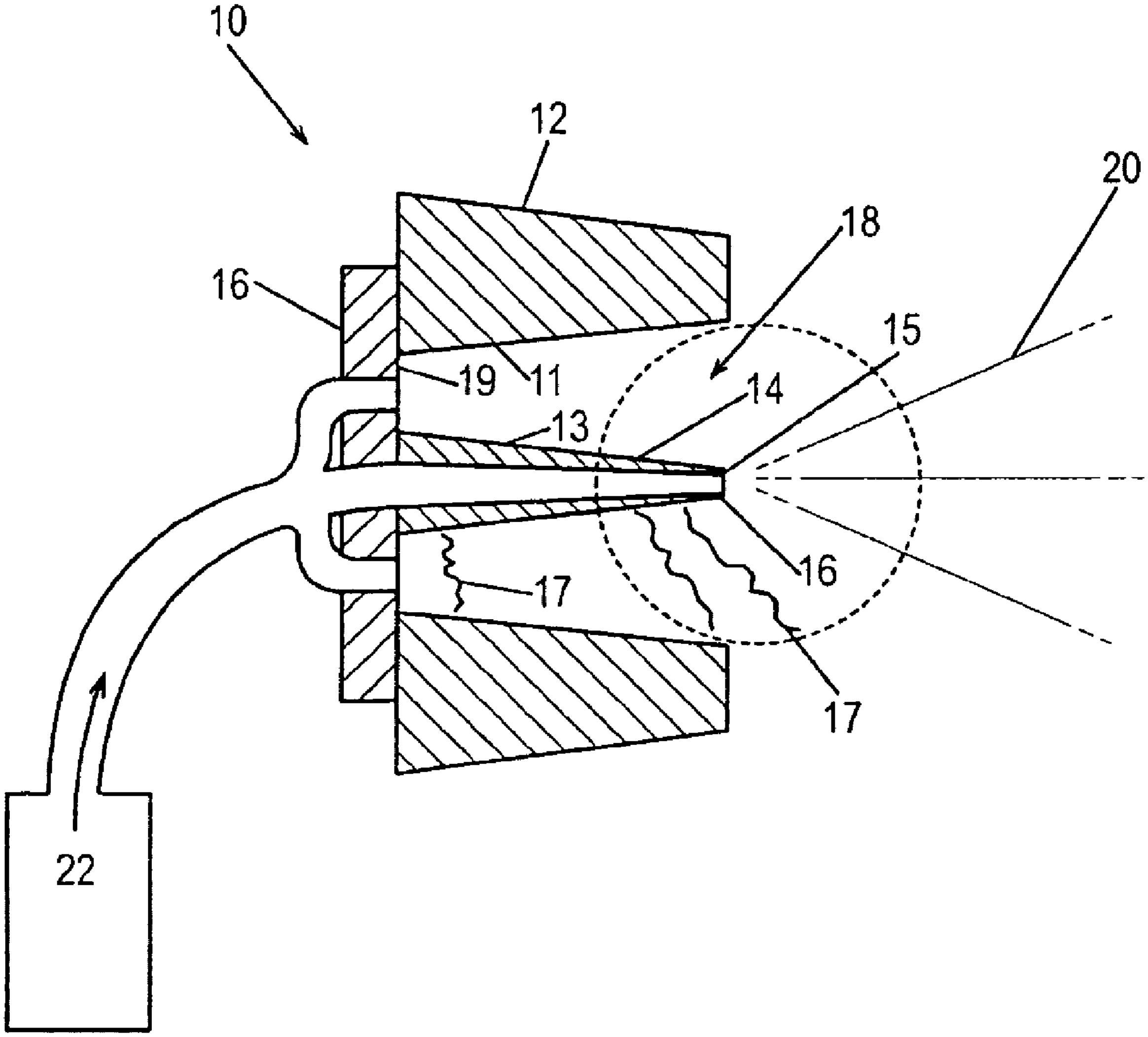
FIG. 1 is a cross-sectional view of an electric discharge gas plasma EUV source.

Embodiments of apparatus and methods of the present invention provide diamond and diamond-like coatings on critical plasma and electrical discharge-exposed surfaces of an electrical discharge gas plasma head 10. Referring again to FIG. 1, the electrical discharge gas plasma head 10 comprises an electrically conductive annular nozzle 12 electrically insulated from a centrally-positioned anode 14 by an insulator base 16 or ring separator. Of particular interest are the plasma-facing components (PFCs) which include: an inner cathode surface 11 of the cathode 12, an outer anode surface 13 of the anode 14, and exposed insulator surfaces 19 of the insulator base 16.

Diamond and diamond-like coatings are used as an erosion-resistant coating for both the anode and cathode, as well as the insulator. Diamond has a high thermal conductivity, 20 W/cm-K (5× better than Copper), and is extremely erosion and thermal shock resistant. Continuous, high quality diamond coatings, or films, can be deposited on various materials by plasma enhanced chemical vapor deposition (CVD) techniques. The thickness of the coating depends on the intended use, but a thickness in the range of about 1–100 μm is indicated for most applications.

Figure 2:
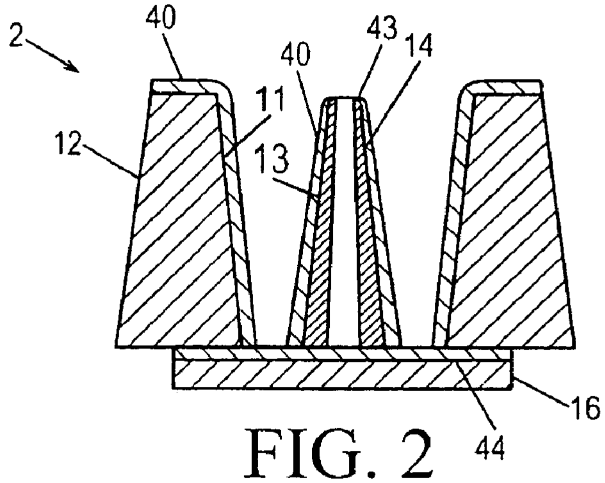
FIG. 2 is a cross-sectional view of a plasma head in accordance with an embodiment of the present invention.

FIG. 2 is a cross-sectional view of a plasma head 2 coated with two types of diamond coatings, one electrically conductive 40 and one electrically insulating 44, in accordance with the present invention. The cathode 12 and the anode 14 are provided with a conductive diamond coating 40 on the inner cathode surface 11 and on the outer anode surface 13.

Diamond can be made conductive by doping the diamond material with a p-type material. Suitable p-type materials include, but are not limited to, Boron and graphite. Boron doping provides a resistivity of 0.1 Ω-cm. Though the resistivity is higher than the cathode 12 and anode 14 materials, the conductive diamond coating 40 will be extremely thin and spread over a large area resulting in a low resistance, for example, $1e^{-3}$ Ω. The thermal load due to passage of large currents through the conductive diamond coating 40 will be conducted away. Also, diamond is a photoconductor, and therefore, the electrical resistivity of the conductive diamond coating 40 decrease in the presence of a bright plasma.

Matching the thermal expansion co-efficient of the conductive diamond coating 40 and the substrate reduces the potential for delamination failure.

Referring again to FIG. 2, an insulating diamond coating 44 is deposited on the insulator base 16. In an embodiment in accordance with the present invention, the insulator base 16 is coated with an insulating diamond coating 44 comprising pure diamond. Pure diamond has a breakdown voltage of 10ˆ7 V/cm, making it a good electrical insulator.

FIG. 5 is a table of insulating materials suitable for accepting an insulating diamond coating 44. Nitroxyceram and IRBAS exhibit good thermal shock resistance, and then coating with an insulating diamond coating 44 for erosion resistance exhibits a very good combination of desirable properties.

Figure 3:
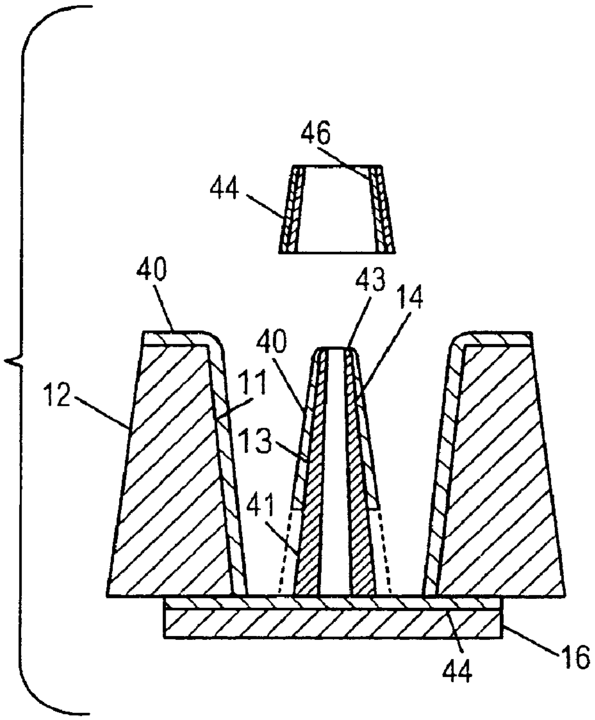
FIG. 3 is a cross-sectional view of a plasma head in accordance with an embodiment of the present invention.

FIG. 3 is a cross-sectional view of a plasma head 3 coated with two types of diamond coatings, one electrically conductive 40 and one electrically insulating 44, in accordance with the present invention. The cathode 12 and the anode 14 is provided with a conductive diamond coating 40 on the inner cathode surface 11 and on the outer anode surface 13. A thin cone 46 adapted to advance over and onto the anode base 41 of the anode 14. The thin cone 46 is coated with an electrically insulating diamond coating 44, wherein, upon installation, the anode base 1 of the anode 14 is electrically insulated. The anode top portion 43 is provided with a conductive diamond coating 40 after the insulating cone 46 is assembled.

Figure 4:
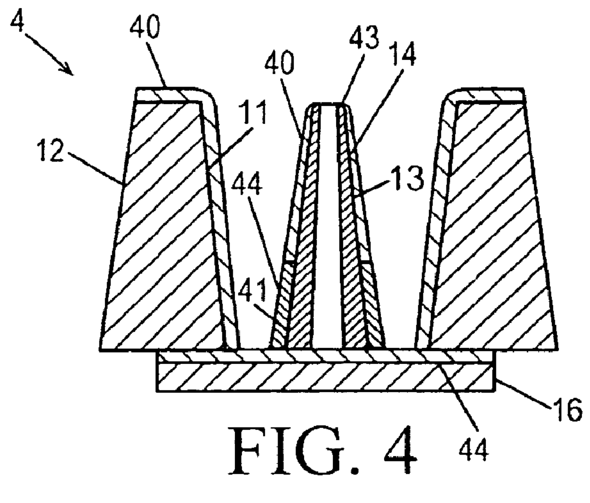
FIG. 4 is a cross-sectional view of a plasma head in accordance with an embodiment of the present invention.

FIG. 4 is a cross-sectional view of a plasma head 4 coated with two types of diamond coatings, one electrically conductive 40 and one electrically insulating 44, in accordance with the present invention. The anode base 41 is provided with an electrically insulating diamond coating 44. The anode top portion 43 and the cathode 12 is provided with a conductive diamond coating 40 on the inner cathode surface 11 and on the outer anode surface 13. In another embodiment, the anode outer surface 13 is coated with an insulating diamond coating 40, and subsequently, the top portion 43 is coated with a conductive diamond coating 40. In yet another embodiment, the anode 14 comprises an anode base 41 and a separate anode top portion 43. The anode base 41 is processed to receive an insulating diamond coating 44 and the top portion 43 is provided with a conductive diamond layer 40. The top portion 43 is coupled with the anode base 41 using a coupling means, such as welding and brazing.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method for protecting radiation source components comprising:

depositing an electrically conductive diamond coating onto plasma-facing surfaces of a cathode and anode of an electrical discharge gas plasma head, the cathode and anode are spaced apart and electrically insulated by an insulator; and depositing a non-electrically conductive diamond coating onto the plasma-facing surface of the insulator.

2. The method of claim 1, wherein depositing an electrically conductive diamond coating onto the plasma-facing surfaces of the cathode and the anode comprises coating the plasma-facing surfaces of the cathode and the anode with a p-doped diamond coating using a chemical vapor deposition process.

3. The method of claim 2, wherein coating the plasma-facing surfaces of the cathode and the anode with a p-doped diamond comprises coating the plasma-facing surfaces of the cathode and the anode with a boron-doped diamond coating.

4. The method of claim 2, wherein coating the plasma-facing surfaces of the cathode and the anode with a p-doped diamond comprises coating the plasma-facing surfaces of the cathode and the anode with a graphite-doped diamond coating.

5. The method of claim 1, wherein depositing a non-electrically conductive diamond coating comprises depositing a pure diamond coating.

6. The method of claim 1, wherein depositing an electrically conductive diamond coating onto plasma-facing surfaces of an anode comprises depositing an electrically non-conductive diamond coating on a portion of the plasma-facing surface of the anode adjacent the insulator and depositing an electrically conductive diamond coating on a portion of the plasma-facing surface of the anode distal to the insulator.

7. The method of claim 1, wherein depositing an electrically conductive diamond coating onto plasma-facing surfaces of an anode comprises:

depositing an electrically non-conductive diamond coating on a base portion of a sleeve, the sleeve adapted to slide over and be in contact with the anode, the sleeve extending the length of the anode, the base portion adjacent the insulator;

and depositing an electrically conductive diamond coating to an upper portion of the sleeve;

advancing the sleeve over the anode wherein the sleeve base rests adjacent the insulator.

8. A method comprising:

depositing an electrically conductive diamond coating onto at least one radiation-facing surface of a plurality of electrodes of a radiation source; and depositing an electrically non-conductive diamond coating onto at least one radiation-facing surface of an insulator, the insulator being adapted to electrically insulate the plurality of electrodes from each other.

9. The method of claim 8, wherein the radiation source comprises a cathode and an anode separated and electrically insulated by the insulator, and the depositing an electrically conductive diamond coating comprises depositing an electrically conductive diamond coating onto radiation-facing surfaces of the cathode and the anode of the radiation source.

10. The method of claim 9, wherein the cathode and anode are disposed coaxially with the anode being surrounded by the cathode.

11. The method of claim 9, wherein the depositing an electrically conductive diamond coating onto radiation-facing surfaces of the cathode and the anode of the radiation source comprises:

depositing an electrically conductive diamond coating onto radiation-facing surfaces of the cathode of the radiation source;

depositing a pure diamond coating onto a portion of the radiation-facing surfaces of the anode proximal to the insulator such that the anode is electrically insulated from the cathode; and depositing an electrically conductive diamond coating onto a remaining portion of the anode not deposited with the pure diamond coating.

12. The method of claim 9, wherein the depositing an electrically conductive diamond coating onto radiation-facing surfaces of the cathode and the anode of the radiation source comprises:

depositing an electrically conductive diamond coating onto radiation-facing surfaces of the cathode and a portion of the anode distal to the insulator;

depositing a pure diamond coating onto a thin cone, the thin cone being adapted to advance onto the anode and cover a remaining portion of the anode not deposited with the electrically conductive diamond coating; and advancing the thin cone onto the anode such that the remaining portion of the anode is electrically insulated from the cathode.

13. The method of claim 8, wherein depositing an electrically conductive diamond coating comprises depositing a diamond coating doped with a material selected from the group consisting of boron and graphite.

14. The method of claim 8, wherein the insulator is constructed from a material selected from the group consisting of Boron Nitride, Silicon Carbide, Insitu Reinforced Barium Aluminosilicate.

* * * * *

UNITED STATES PATENT AND TRADEMARK OFFICE

CERTIFICATE OF CORRECTION

PATENT NO. : 7,041,993 B2
APPLICATION NO. : 10/921407
DATED : May 9, 2006
INVENTOR(S) : Chandhok et al.

It is certified that error appears in the above-identified patent and that said Letters Patent is hereby corrected as shown below:

In the Drawings:
Sheet 2, Fig 3, insert numeral 3 so it applies to the plasma head. This corrected drawing now properly reflects all reference numbers.

FIG. 3

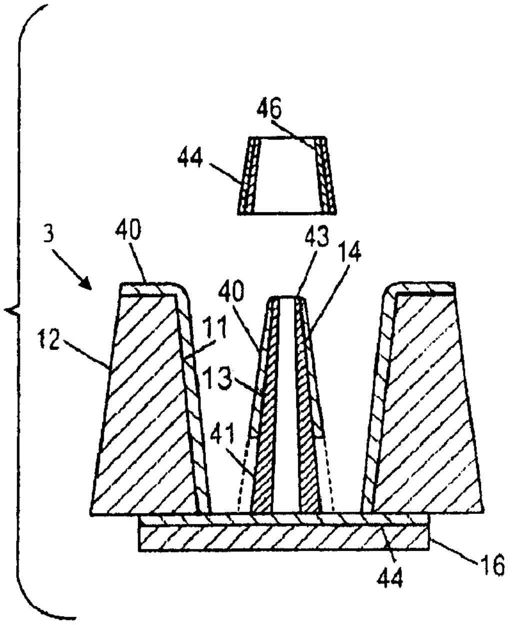

Column 4
Line 7, "...anode base 1..." should read --...anode base 41...--.

Signed and Sealed this

Fourteenth Day of October, 2008

JON W. DUDAS
*Director of the United States Patent and Trademark Office*